(12) United States Patent
Knoedgen

(10) Patent No.: US 9,217,761 B2
(45) Date of Patent: Dec. 22, 2015

(54) CURRENT MEASUREMENT VIA GATE OF EXTERNAL TRANSISTOR

(71) Applicant: Dialog Semiconductor GmbH, Kirchheim/Teck-Nabern (DE)

(72) Inventor: Horst Knoedgen, Munich (DE)

(73) Assignee: Dialog Semiconductor GmbH, Kirchheim/Teck-Nabern (DE)

( * ) Notice: Subject to any disclaimer, the term of this patent is extended or adjusted under 35 U.S.C. 154(b) by 288 days.

(21) Appl. No.: 14/043,940

(22) Filed: Oct. 2, 2013

(65) Prior Publication Data

US 2014/0097824 A1 Apr. 10, 2014

(30) Foreign Application Priority Data

Oct. 8, 2012 (EP) .................................... 12187623

(51) Int. Cl.
*G01R 19/00* (2006.01)
*H03K 17/0812* (2006.01)
*H02M 3/158* (2006.01)
*H02M 1/00* (2007.01)

(52) U.S. Cl.
CPC .......... *G01R 19/00* (2013.01); *H03K 17/08122* (2013.01); *H02M 3/158* (2013.01); *H02M 2001/0009* (2013.01); *H03K 2217/0027* (2013.01)

(58) Field of Classification Search
CPC ......... H02M 3/158; H02M 1/14; H02M 1/36; H02M 1/4258; H02M 2001/0054; H02M 3/156; H02M 3/33569; H02M 2001/0009; H02M 3/33507; H02J 7/0029; H02J 7/022; H03K 17/102; H03K 17/08122; H03K 2217/0027; G01R 19/00
See application file for complete search history.

(56) References Cited

U.S. PATENT DOCUMENTS

| 6,057,728 | A | * | 5/2000 | Igarashi | ............. | H03K 17/0828 |
| | | | | | | 327/427 |
| 7,948,277 | B2 | * | 5/2011 | Nakatake | ......... | H03K 17/08128 |
| | | | | | | 327/109 |
| 8,692,606 | B2 | * | 4/2014 | Knoedgen | ............. | H03K 17/163 |
| | | | | | | 326/26 |
| 8,971,080 | B2 | * | 3/2015 | Weis | ..................... | H02M 7/217 |
| | | | | | | 363/127 |
| 2007/0257725 | A1 | | 11/2007 | De et al. | | |
| 2011/0080205 | A1 | | 4/2011 | Lee | | |

OTHER PUBLICATIONS

European Search report 12187623.9-1233 mailed Jan. 4, 2013.*

* cited by examiner

*Primary Examiner* — Vinh Nguyen
(74) *Attorney, Agent, or Firm* — Saile Ackerman LLC; Stephen B. Ackerman; Larry J. Prescott

(57) ABSTRACT

A control circuit for a switch, configured to measure the drain-to-source current of the switch is described. The control circuit is configured to control an external transistor and comprises a control pin coupled to the gate of an external transistor. The external transistor and a level shifting unit are coupled to the control pin and configured to isolate an AC current from the control pin; at a time instant subsequent to the first pulse duration, the isolated AC component of the voltage potential is indicative of a drain-to-source current through the external transistor.

19 Claims, 2 Drawing Sheets

CURRENT MEASUREMENT VIA GATE OF EXTERNAL TRANSISTOR

TECHNICAL FIELD

The present document relates to the measurement of the drain-to-source current of a switch, e.g. of a transistor. In particular, the present document relates to a control circuit for a switch, wherein the control circuit is configured to measure the drain-to-source current of the switch.

BACKGROUND

Switches, e.g. switched transistors, are used in various applications such as switched-mode power supplies. The switches in such applications are typically controlled using a control circuit which is configured to control the switch such that the switch alternates between an on-state (where the switch is conducting or closed) and an off-state (where the switch is blocking or open) according to a commutation cycle rate. A commutation cycle typically comprises one period where the switch is in on-state and one period where the switch is in off-state. A duty cycle of the switch is typically defined as the ratio of the length of the period where the switch is in on-state and the length of the commutation cycle.

The control circuit of the switch may be configured to control the commutation cycle rate and/or the duty cycle of the switch. In this context, it may be beneficial to provide the control circuit with information regarding the current flowing through the switch (e.g. regarding the drain-to-source current flowing through a switched transistor). For this purpose, the control circuit may comprise a current sensing pin which is configured to be coupled to appropriate current sensing means (e.g. a shunt resistor) at the switch.

The use of a dedicated current sensing pin is, however, disadvantageous, because an additional pin typically renders the design of the control circuit more complicated and increases the cost of the control circuit. It is therefore desirable to provide information regarding the current through the switch without the need of a dedicated current sensing pin.

SUMMARY

According to an aspect, a control circuit configured to control an external transistor to switch from an off-state to an on-state is described. The external transistor may be part of a switched-mode power converter, e.g. of a buck converter. The external transistor may comprise a gate, a source and/or a drain. The source of the external transistor may be coupled to a shunt resistor. In particular, the source of the external transistor may be (directly) coupled to ground via the shunt resistor. Furthermore, the drain of the transistor may be coupled to an inductor. In other words, the external transistor may be submitted to an inductive load. The control circuit may be implemented as an integrated circuit (IC) which is separate from the external transistor. In other words, the external transistor may not be implemented within the same IC as the control circuit.

The control circuit may comprise a control pin configured to be coupled to the gate of the external transistor. As such, the control circuit may be configured to generate a control signal which may be passed to the external transistor via the control pin. Furthermore, the control circuit may comprise a high side control switch which is coupled to the control pin and which is configured to generate a pulsed on-signal by coupling the control pin to a supply voltage of the control circuit for a first pulse duration. In other words, the high side control switch may be used to generate a control signal for the external transistor, wherein the control signal comprises a pulsed on-signal. The pulsed on-signal may have a potential which corresponds to the supply voltage of the control circuit (wherein the supply voltage may e.g. be 5V or less; notably in automotive or lightning applications the supply voltage may be in the range of 10 to 20 V). Furthermore, the pulsed on-signal may have a length which corresponds to the first pulse duration.

The pulsed on-signal may be configured to put the external transistor to the on-state, when the external transistor is coupled to the control pin. In particular, the first pulse duration of the pulsed on-signal and/or the potential (i.e. the supply voltage) of the pulsed on-signal may be designed such that the external transistor is put into the on-state. Even more particularly, the pulsed on-signal may be configured such that a current flowing through the control pin for the first pulse duration is sufficient to charge a gate capacitance of the external transistor.

Furthermore, the control circuit may comprise a level shifting unit (comprising e.g. a coupling capacitor) coupled at its first end to the control pin and configured to isolate an alternating current (AC) component from a voltage potential at the control pin (which may correspond to the voltage potential at the gate of the external transistor, if the external transistor is coupled to the control pin). The level shifting unit may e.g. comprise a coupling capacitor and/or an amplifier. The control circuit may be configured such that at a time instant (or within a time interval) subsequent to the first pulse duration, the isolated AC component of the voltage potential is indicative of a drain-to-source current through the external transistor, when the external transistor is coupled to the control pin. In particular, the control circuit may be configured to let the control pin float at the time instant or within the time interval subsequent to the first pulse duration. As such, changes of the voltage across the external shunt resistor, i.e. changes of the potential of the source of the external transistor, may be coupled via the gate-source capacitance of the external transistor to the gate of the external transistor, thereby leading to corresponding changes of the potential of the gate of the external transistor. The changes of the potential of the gate of the external transistor may be captured by the control pin of the control circuit and may be isolated by the level shifting unit (e.g. the coupling capacitor).

The control circuit may further comprise a low side control switch which is coupled to the control pin and which is configured to generate a pulsed off-signal by coupling the control pin to ground for a second pulse duration. The pulsed off-signal may be configured (e.g. the second pulse duration may be selected) to put the external transistor to the off-state, when the external transistor is coupled to the control pin. As such, the control circuit may be configured to generate a gate control signal comprising a sequence of alternating pulsed on-signals and pulsed off-signals, thereby operating the external transistor in alternating on-states and off-states, respectively.

A ratio of the first pulse duration and a duration between a beginning of the pulsed on-signal and a beginning of the subsequent pulsed off-signal may be less than 50%, less than 30%, less than 20%, less than 10%, or less than 5%. In other words, typically there is a time interval, with a length greater zero, between the end of the pulsed on-signal and the beginning of a subsequent off-signal. On the other hand, the first pulse duration is typically sufficiently long to ensure a (reliable) switch-on of the external transistor. The control circuit may be configured such that the control gate is floating during the time interval between the end of the pulsed on-signal and the beginning of a subsequent off-signal. In other words, the control circuit may be configured such that the control gate is floating between the end of the pulsed on-signal and the beginning of the subsequent pulsed off-signal.

The control circuit may further comprise an auto-zeroing switch arranged between the level shifting unit (e.g. the coupling capacitor) and ground. In particular, the auto-zeroing switch may be coupled at one side to the second side of the coupling capacitor and on the other side to ground. As such, the control circuit may be configured to couple the second end of the coupling capacitor to ground, when the auto-zeroing switch is in on-state. The control circuit may be configured to open and/or close the high side control switch and the auto-zeroing switch in a synchronized manner. As such, the control circuit may be configured to pre-charge the coupling capacitor.

The control circuit may further comprise a buffering device configured to store the isolated AC component of the voltage potential at the control pin. The buffering device may e.g. comprise an operational amplifier. Alternatively or in addition, the control circuit may further comprise a comparator configured to compare the isolated AC component to a pre-determined threshold. The pre-determined threshold may be tunable, thereby allowing for a comparison to different pre-determined thresholds. The comparator may be used to detect a peak within the isolated AC component.

According to another aspect, a circuit arrangement is described. The circuit arrangement may comprise a transistor which comprises a drain, a source and/or a gate. The transistor may be a metal oxide semiconductor field effect transistor (MOSFET), e.g. of n-type. Furthermore, the circuit arrangement may comprise an inductor coupled to the drain of the transistor. The transistor and/or the inductor may be part of a switched-mode power converter, e.g. of a buck converter. In addition, the circuit arrangement may comprise a shunt resistor coupled to the source of the transistor. Furthermore, the circuit arrangement may comprise a control circuit which is coupled to the gate of the transistor (e.g. via a control pin of the control circuit). The control circuit may be configured according to any of the features described in the present document. The control circuit may be implemented on a different IC than the other components of the circuit arrangement.

According to another aspect, a method for controlling an external transistor to switch from an off-state to an on-state is described. The external transistor comprises a gate and a source. The source of the external transistor is coupled to a shunt resistor. The method may comprise coupling a control pin to the gate of the external transistor. Furthermore the method may comprise coupling a high side control switch to the control pin. The method may proceed in generating a pulsed on-signal by coupling the control pin to a supply voltage for a first pulse duration, thereby putting the external transistor to the on-state. In addition, the method may comprise isolating an alternating current, referred to as AC, component from a voltage potential at the control pin. At a time instant subsequent to the first pulse duration, the isolated AC component of the voltage potential may be indicative of a drain-to-source current through the external transistor.

It should be noted that the methods and systems including its preferred embodiments as outlined in the present document may be used stand-alone or in combination with the other methods and systems disclosed in this document. In addition, the features outlined in the context of a system are also applicable to a corresponding method. Furthermore, all aspects of the methods and systems outlined in the present document may be arbitrarily combined. In particular, the features of the claims may be combined with one another in an arbitrary manner.

In the present document, the term "couple" or "coupled" refers to elements being in electrical communication with each other, whether directly connected e.g., via wires, or in some other manner.

The invention is explained below in an exemplary manner with reference to the accompanying drawings.

DETAILED DESCRIPTION

As indicated in the introductory section, the present document relates to a control circuit for controlling the switching state of an external switch (e.g. of a switched transistor). In the following the various aspects of the control circuit are described in the context of a switched-mode power converter, notably in the context of a buck converter. It should be noted, however, that the various aspects of the control circuit are applicable to switches used in various other applications, in particular to switches which are submitted to an inductive load.

Figure 1:
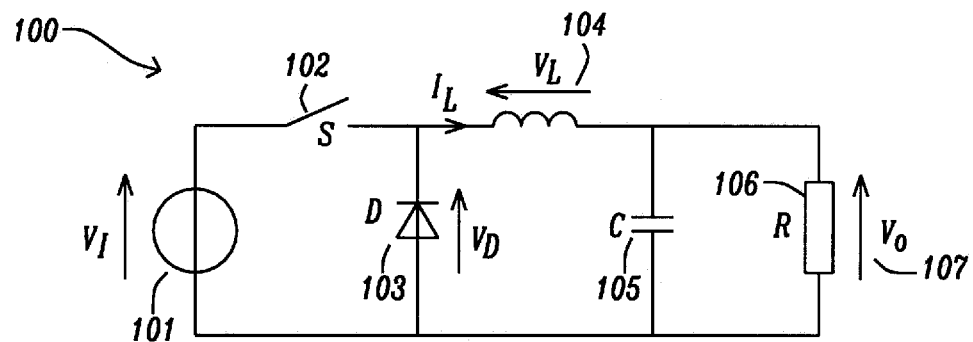
FIG. 1 illustrates a block diagram of an example buck converter.

FIG. 1 illustrates an example buck converter 100. Buck converters 100 may be provided in electronic devices e.g. to convert a battery voltage $V_i$ 101 into the supply voltage $V_O$ 107 of the load 106. A typical buck converter 100 comprises two switches 102, 103 (e.g. transistors 102 and 103), as well as an inductor 104 and a capacitor 105. The two switches 102, 103 control the current through the inductor 104 and thereby provide for a voltage modification (step-down conversion) from the input voltage $V_i$ 101 (e.g. a battery voltage) down to the voltage $V_O$ 107 at the load 106. A buck converter 100 may be operated in a so-called continuous mode, where the current through the inductor 104 never falls to zero. Alternatively, the buck converter 100 may be operated in a so-called discontinuous mode for which the current through the inductor may fall to zero during parts of the commutation cycles performed by the two switches 102, 103.

The buck converter 100 is typically operated in two states forming an overall commutation cycle. In a first state the switch 102, referred to as the high side switch 102, is closed (on-state), whereas the second switch 103, referred to as the low side switch 103, is open. During the first state (referred to as the on-state of the buck converter 100) the voltage across the inductor 104 is given by the difference of the input voltage $V_i$ 101 and the load voltage $V_O$ 107. During the first stage the energy stored in the inductor 104 increases as the current through the inductor 104 increases. In a second state (referred to as the off-state of the buck converter 100) the first switch 102 is opened and the second switch 103 is closed. If the voltage drop across the second switch 103 can be neglected, the voltage across the inductor 104 is the negative voltage $V_O$ 107 across the load 106. During the off-state of the buck converter 100, the energy stored within the inductor 104 is released towards the load 107 via a decreasing current through the inductor 104.

Figure 2:
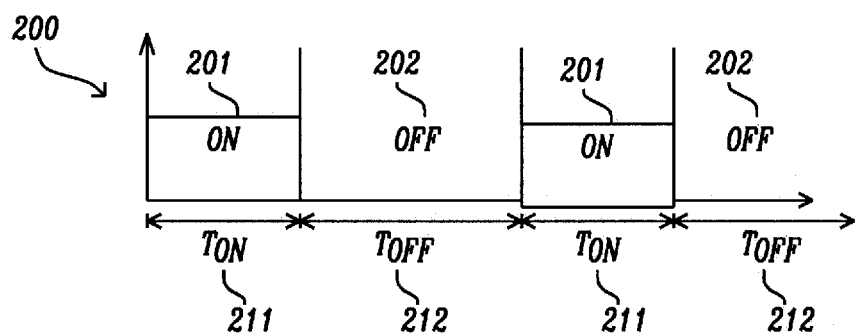
FIG. 2 illustrates a switching diagram for an example buck converter.

In order to provide a voltage conversion of the input voltage $V_i$ 101 to the load voltage $V_O$ 107, the buck converter 100 is commutating between the on-state and the off-state in a repetitive manner. This is illustrated in FIG. 2, where a switching diagram 200 is illustrated. It can be seen that the buck converter 100 commutates between the on-state 201 and the off-state 202 in a periodic manner. By appropriately setting the duration 211 of the on-state and the duration 212 of the off-state, the ratio between the load voltage $V_O$ 107 and the input voltage $V_i$ 101 can be tuned. The ratio between the duration 211 of the on-state and the duration of a commutation cycle (i.e. the sum of duration 211 and duration 212) is typically referred to as the duty cycle of the buck converter 100.

During the on-state of the buck converter 100, the high side switch 102 is in the on-state and the low side switch 103 is in the off-state. During the off-state of the buck converter 100, the high side switch 102 is in the off-state and the low side switch 103 is in the on-state.

The performance of the buck converter 100 depends on the characteristics of the different components of the buck converter 100. As such, the output capacitor 105 should have enough capacitance to supply sufficient power to the load 106 without any noticeable variations of the load voltage $V_O$ 107 during the different commutation states 201, 202. In other words, the capacitor 105 should be appropriately selected to reduce output voltage ripples. Furthermore, the voltage drop across the switch 103, when closed, should be as low as possible (preferably zero). Due to this reason the low side switch 103 is typically implemented as an N-channel transistor, when implementing the buck converter 100 using a metal oxide-semiconductor (MOS) structure. In other words, the low side switch 103 may be implemented as a NMOS transistor. This is advantageous due to the fact that N-channel transistors typically have a lower on-resistance $R_{on}$ compared to P-channel transistors. A typical value for the $R_{on}$ of an NMOS transistor is in the range of 100 mΩ, whereas the $R_{on}$ of a PMOS transistor is in the range of 1Ω. Consequently, the losses of a buck converter can be reduced by using a NMOS low side transistor 103.

The low side switch 103 of the buck converter 100 may be traversed by significant currents (e.g. by significant drain-to-source currents in case of a MOS transistor 103), particularly in situations where the low side switch 103 is switched off under load. Such situations may occur when the buck converter 100 has to discharge the capacitor 105, while the low side switch 103 is switched to its off-state. In this context, it should be noted that the load connected to a buck converter 100 may vary significantly. For example, the processors of modern electronic devices are frequently put into a sleep mode and are only activated when required, in view of a more efficient energy management. This may lead to situations, where the load currents requested by the processor vary from a low value (e.g. in the range of 100 mA) during sleep mode to a high value (e.g. up to 20 A) when being activated, and vice versa. As such, the currents through the low side switch 103 may be significant, if the buck converter is under load (e.g. when the processor connected to the buck converter is activated). The current through the low side switch 103 may be further increased if the load changes (e.g. if the processor is switched off), as this may lead to a discharge of the capacitor 105, thereby providing an additional current through the low side switch 103. In particular, if the load (e.g. the processor) is switched off, the charge in the capacitor 105 has to be discharged via the low side switch 103. This means that the low side switch 103 has to be switched off under current, thereby increasing the risk of operating the low side switch 103 outside the safe operation area.

Figure 3:
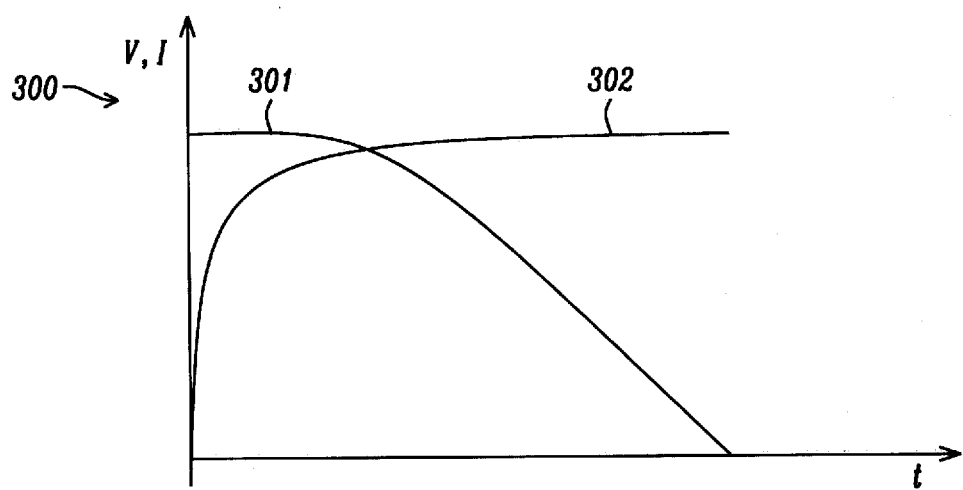
FIG. 3 shows example currents and voltages at the low side switch of an example buck converter.

Consequently, the current through the low side switch 103 may be significant when switching off the low side switch 103. Typically, the coil (i.e. the inductor 104) is significantly faster than the switch off time of the switch 103. This leads to an almost instant voltage drop across the low side switch 103 when switching off the low side switch 103, in combination with a high current through the low side switch 103 (due to the relatively slow switch off time of the low side switch 103). Hence, there is a risk that the low side switch 103 no longer operates in the save operating area, as it is concurrently submitted to a high voltage and a high current. This is illustrated in the diagram 300 of FIG. 3. It can be seen that the current 301 through the low side switch 103 reduces at a slower rate than the increase of the voltage 302 across the low side switch 103. This is due to the relatively slow switch off time (in the range of 1-2 ns for low voltage switches, and possibly higher for higher voltage switches) of the low side switch 103 compared to the reaction time of the inductor 104. As a result of the concurrent high voltage 302 and high current 301, an NMOS based low side switch 103 may leave the safe operation area and may be destroyed.

For at least the above mentioned reasons, it may be beneficial to provide the control circuit for the low side switch 103 with information regarding the current 301 (e.g. the drain-to-source current) which traverses the low side switch 103. The control circuit may then be enabled to detect a situation with high currents and to take appropriate measures to protect the low side switch 103. Other applications (e.g. an hysteretic control scheme) may make use of the information regarding the current 301 for controlling the low side switch 103 (e.g. for controlling the switching time instants of the low side switch 103).

Figure 4:
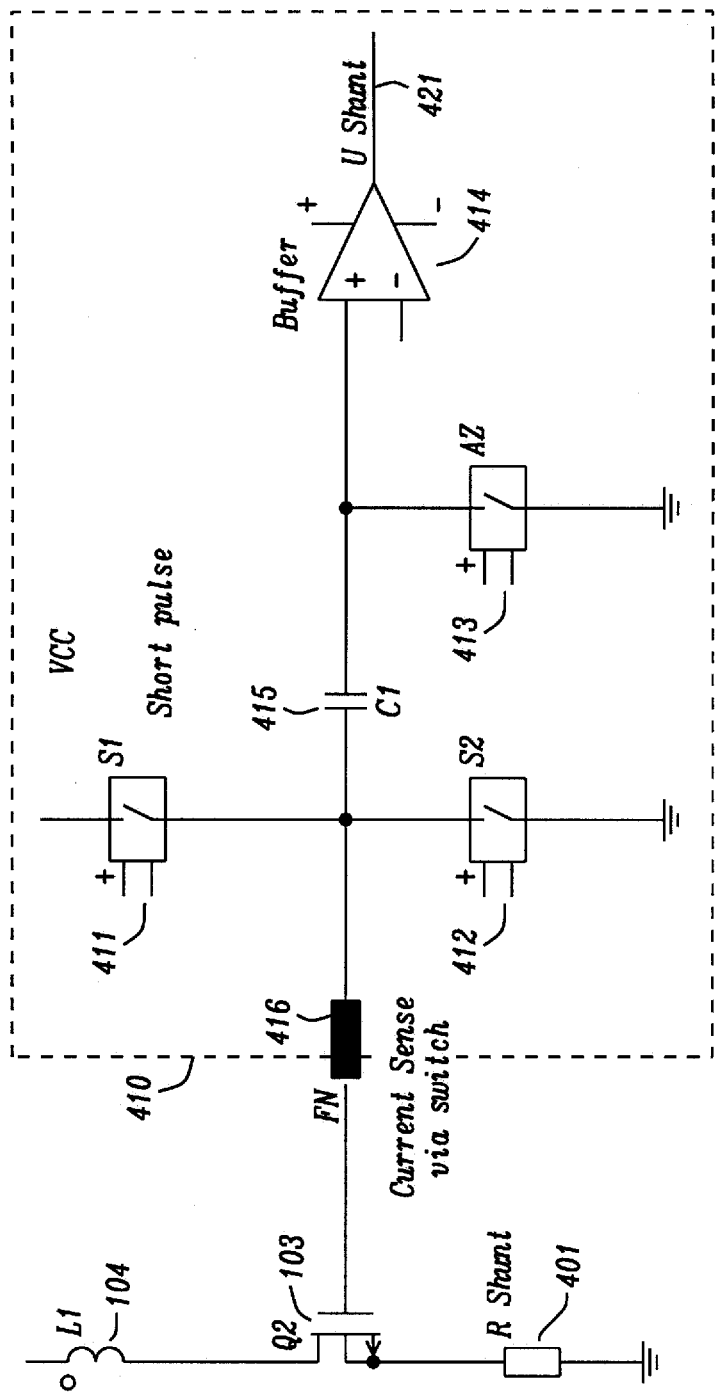
FIG. 4 shows a block diagram of an example control circuit for an external switch, e.g. for the low side switch of the buck converter of FIG. 1.

The provision of information regarding the current through the low side switch 103 may be achieved by using current sensing means (e.g. a shunt resistor) at the low side switch 103 and by providing the control circuit with a current sensing pin which is configured to be coupled to the current sensing means. By way of example, the switch 103 may be arranged in series with a shunt resistor 401 (as illustrated in FIG. 4), and the control circuit of the switch 103 may comprise a current sensing pin to receive the voltage drop across the shunt resistor 401 (which is proportional to the current through the switch 103). This, however, is disadvantageous as the control circuit requires an additional pin which increases the cost of the control circuit.

FIG. 4 illustrates a block diagram of an example control circuit 410 for an external switch 103 (i.e. for a switch 103 which is external to the control circuit 410). The external switch 103 may e.g. be the low side switch of a buck converter. The control circuit 410 comprises a control pin 416 which is configured to be coupled to a control port of the external switch 103. By way of example, the control pin 416 may be coupled to a gate of a switched transistor 103. The control circuit 410 may be configured to provide a control signal via the control pin 416 to the external switch 103. The control signal may comprise an on-signal for putting the external switch 103 to the on-state. Alternatively or in addition, the control signal may comprise an off-signal for putting the external switch 103 to the off-state. By way of example, the control signal may comprise a gate voltage to be applied to the gate of the switched transistor 103. The on-signal may comprise a high voltage (e.g. a voltage at the supply voltage Vcc of the control circuit 410), and the off-signal may comprise a low voltage (e.g. a voltage at ground level).

In the illustrated example, the control circuit 410 is configured to generate a pulsed control signal comprising one or more pulsed on-signals and/or one or more pulsed off-signals. For this purpose, the control circuit 410 comprises a high side control switch 411 which is configured to couple the pin 416 with the supply voltage Vcc of the control circuit 410, when the high side control switch 411 is in on-state. The supply voltage Vcc may e.g. be in the range of 5V. Furthermore, the control circuit 410 comprises a low side control switch 412 which is configured to couple the pin 416 with ground, when the low side control switch 412 is in on-state. In particular, the high side control switch 411 may be configured to generate a pulsed on-signal (e.g. a pulse of high voltage at the supply voltage Vcc), and the low side control switch 412 may be configured to generate a pulsed off-signal (e.g. a pulse of low voltage at ground level).

Typically, the control signal comprises a sequence of alternating pulsed on-signals and pulsed off-signals. The pulsed on-signals and pulsed off-signals are alternating according to the commutation cycle rate, thereby controlling the external switch 103 to go to on-state and off-state, respectively, according to the commutation cycle rate. The pulsed on-signal, in particular the length of the pulsed on-signal, is typically designed such that it provides sufficient charge to the gate of the switched transistor 103, in order to charge the gate capacitance of the switched transistor 103 and to thereby put the switched transistor 103 to the on-state. In a similar manner, the pulsed off-state, in particular the length of the pulsed off-signal, is typically designed such that it allows for a discharge of the gate capacitance of the switched transistor 103, to thereby put the switched transistor 103 to the off-state. The pulsed on-state and/or off-state typically have lengths which sum up to less than the length of the commutation cycle. The ratio of the sum of the lengths of the on-state and the off-state to the length of the commutation cycle is typically 50% or less, 20% or less, 10% or less, or 5% or less.

Subsequent to the generation and application of a pulsed on-signal by the control circuit 410, the external switch 103 is put into the on-state. As a result, a current through the inductor 104 and through the switch 103 may be ramped up. Reference is made by way of example to the buck converter 100 of FIG. 1. When the low side switch 103 is put in the on-state, the high side switch 102 is typically in off-state. The voltage $V_L$ across the inductor 104 will induce a current ramp up through the low side switch 103, wherein the gradient of the current dI/dt through the switch 103 is typically given by $L*dI/dt=V_L$, wherein L is the inductance of the coil 104.

The increasing current I through the switch 103 leads to an increasing voltage drop across the shunt resistor 401 which leads to an increasing potential of the control port of the switch 103 (e.g. of the gate of the switched transistor 103). In particular, in case of a switched transistor 103 (e.g. a MOS transistor), the increasing potential of the source of the transistor 103 is coupled via the gate-source capacitance of the transistor 103 to the floating gate of the transistor 103. As such, the increasing potential can be measured at the floating gate of the transistor 103. As outlined above, the voltage potential at the source of the transistor 103 (i.e. the voltage drop across the shunt resistor 401) is proportional to the drain-to-source current through the transistor 103. This means that the potential of the floating gate is proportional to the drain-to-source current through the transistor 103, such that by measuring the potential of the floating gate via the control pin 416, the drain-to-source current through the transistor 103 can be measured.

Subsequent to the generation of the pulsed on-signal, the control switches 411, 412 are in off-state. As such, the gate of the transistor 103 is floating. The increasing potential of the floating gate (due to the increasing potential of the source of the transistor 103) may be coupled as an AC (alternating current) component via the coupling capacitor 415 to a buffering device 414 (e.g. an operational amplifier) which then provides an indication 421 of the voltage drop across the shunt resistor 401 (i.e. an indication of the drain-to-source current through the transistor 103). The buffering device 414 may e.g. be an operational amplifier, a gm amplifier or transconductance amplifier (e.g. with or without a sample and hold structure), a common-source amplifier or a source-follower amplifier. The buffering device 414 may be configured to provide a relatively low resistive load to the coupling capacitor 415. This is due to the fact that the coupling capacitor 415 typically has a relatively small capacitance (in the range of several pF).

The coupling capacitor 415 may be configured to filter out the DC (direct current) component of the potential at the floating gate, which is typically due to the threshold voltage $V_T$ of the transistor 103. On the other hand, the coupling capacitor 415 is typically configured to let pass the AC component of the potential of the floating gate, which is due to the increasing drain-to-source current through the shunt resistor 401. As such, the drain-to-source current through the shunt resistor 401 can be measured as a level shift of the coupling capacitor 415.

The control circuit 410 may further comprise an auto-zeroing switch 413 which is configured to ensure that during the generating of the on-signal by the control circuit 410 (in particular by the high side control switch 411), the coupling capacitor 415 is pre-charged in accordance to the supply voltage Vcc. As such, it can be ensured that only the AC component of the gate potential (which corresponds to the voltage drop across the shunt resistor 401) is coupled via the coupling capacitor 415 to the buffering device 414. In other words, by doing this, the capacitor 415 provides a level shift. Typically, the auto-zeroing switch 413 is opened and/or closed in a synchronized manner with the high side control switch 411.

Hence, the control circuit 410 is configured to measure the drain-to-source current through the external transistor 103 via the control pin 416. The measurement of the drain-to-source current through the external transistor 103 is typically only possible subsequent to the generation of the pulsed on-signal, i.e. at time instants when the high side control switch 411, as well as the low side control switch 412 and the auto-zeroing switch 413 are open (i.e. when the control pin 416 and the gate of the transistor 103 is floating). As such, it is preferable to select the duration of the pulsed on-signal as short as possible, such that the pulsed on-signal ensures a reliable opening of the external transistor 103 (e.g. such that the pulsed on-signal ensures a complete charging of the gate capacitance of the transistor 103). If the load to the transistor 103 is known, the drain-to-source current at time instants during the pulsed on-signal may be reconstructed from the measured drain-to-source current at time instants when the gate of the transistor 103 is floating. By way of example, if the load is an inductor (such as inductor 104), the drain-to-source current at time instants during the pulsed on-signal may be reconstructed from the gradient of the ramp of the measured drain-to-source current.

In the present document, a control circuit for controlling the switching state (i.e. the on/off state) of a switch (e.g. a switched transistor) is described. The control circuit is configured to sense the current through the switch via the control pin of the control circuit. As a result, the control circuit does not require an explicit current sensing pin, i.e. as a result, the number of pins of the control circuit can be reduced, thereby reducing the cost of the control circuit.

It should be noted that the description and drawings merely illustrate the principles of the proposed methods and systems. Those skilled in the art will be able to implement various arrangements that, although not explicitly described or shown herein, embody the principles of the invention and are included within its spirit and scope. Furthermore, all examples and embodiment outlined in the present document are principally intended expressly to be only for explanatory purposes to help the reader in understanding the principles of the proposed methods and systems. Furthermore, all statements herein providing principles, aspects, and embodiments of the invention, as well as specific examples thereof, are intended to encompass equivalents thereof.

What is claimed is:

1. A control circuit configured to control an external transistor to switch from an off-state to an on-state, wherein the external transistor comprises a gate and a source, wherein the source of the external transistor is coupled to a shunt resistor, the control circuit comprising:
    a control pin configured to be coupled to the gate of the external transistor;
    a high side control switch coupled to the control pin and configured to generate a pulsed on-signal by coupling the control pin to a supply voltage of the control circuit for a first pulse duration, thereby putting the external transistor to the on-state, when the external transistor is coupled to the control pin; and
    a level shifting unit coupled at a first end to the control pin and configured to isolate an alternating current, referred to as the AC, component of a voltage potential at the control pin; wherein at a time instant subsequent to the first pulse duration, the isolated AC component of the voltage potential is indicative of a drain-to-source current through the external transistor, when the external transistor is coupled to the control pin.

2. The control circuit of claim 1, wherein the external transistor comprises a drain and the drain of the external transistor is coupled to an inductor.

3. The control circuit of claim 1, further comprising a low side control switch which is coupled to the control pin and which is configured to generate a pulsed off-signal by coupling the control pin to ground for a second pulse duration, thereby putting the external transistor to the off-state when the external transistor is coupled to the control pin.

4. The control circuit of claim 3, wherein the control circuit is configured to generate a gate control signal comprising a sequence of alternating pulsed on-signals and pulsed off-signals, thereby operating the external transistor in alternating on-states and off-states, respectively.

5. The control circuit of claim 4, wherein a ratio of the first pulse duration and a duration between a beginning of the pulsed on-signal and a beginning of the subsequent pulsed off-signal is less than 50%.

6. The control circuit of claim 3, wherein the control gate is floating between an end of the pulsed-on signal and the beginning of a subsequent pulsed-off signal.

7. The control circuit of claim 1 wherein a current flowing through the control pin during the first pulse duration is sufficient to charge a gate capacitance of the external transistor.

8. The control circuit of claim 1 wherein the level shifting unit comprises a coupling capacitor.

9. The control circuit of claim 8, further comprising an auto-zeroing switch arranged between the coupling capacitor and ground, and configured to couple a second end of the coupling capacitor to ground, when in the on-state.

10. The control circuit of claim 9 wherein the high side control switch and the auto-zeroing switch are opened and closed in a synchronized manner.

11. The control circuit of claim 1, further comprising a buffering device configured to store the isolated AC component of the voltage potential at the control pin and/or a comparator configured to compare the isolated AC component to a pre-determined threshold.

12. The control circuit of claim 1, wherein the supply voltage is equal to or less than five volts.

13. A circuit arrangement; comprising:
    a transistor comprising a drain, a source, and a gate;
    an inductor coupled to the drain of the transistor;
    a shunt resistor coupled to the source of the transistor;
    a control pin configured to be coupled to the gate of the transistor;
    a high side control switch coupled to the control pin and configured to generate a pulsed on-signal by coupling the control pin to a supply voltage of the circuit arrangement for a first pulse duration, thereby putting the transistor to the on-state, when the transistor is coupled to the control pin; and
    a level shifting unit coupled at a first end to the control pin and configured to isolate an alternating current, referred to as the AC, component of a voltage potential at the control pin; wherein at a time instant subsequent to the first pulse duration, the isolated AC component of the voltage potential is indicative of a drain-to-source current through the transistor, when the transistor is coupled to the control pin.

14. The circuit arrangement of claim 13 wherein the transistor is a metal oxide semiconductor field effect transistor.

15. The circuit arrangement of claim 13 wherein the transistor is an n channel field effect transistor.

16. The circuit arrangement of claim 13, wherein the transistor and the inductor are part of a switched-mode power converter such as a buck converter.

17. A method of controlling an external transistor to switch between an off-state and an on-state, wherein the external transistor comprises a gate and a source, comprising:
    providing a control pin configured to be coupled to the gate of the external transistor;
    providing a high side control switch coupled to the control pin and configured to generate a pulsed on-signal by coupling the control pin to a supply voltage of the control circuit for a first pulse duration, thereby putting the external transistor to the on-state, when the external transistor is coupled to the control pin;
    providing a level shifting unit coupled at a first end to the control pin and configured to isolate an AC component of a voltage potential at the control pin; and
    measuring, at a time instant subsequent to the first pulse duration, the isolated AC component of the voltage potential at the control pin; and
    determining the drain-to-source current through the external transistor from the isolated AC component of the voltage potential at the control pin, when the external transistor is coupled to the control pin.

18. The method of claim 17 wherein the external transistor further comprises a drain and the drain of the external transistor is coupled to an inductor.

19. The method of claim 17, further comprising providing a low side control switch which can be coupled to the control pin and configured to generate a pulsed off-signal by coupling the control pin to ground for a second pulse duration, thereby putting the external transistor to the off-state when the external transistor is coupled to the control pin.

\* \* \* \* \*